(12) United States Patent
O'Dowd et al.

(10) Patent No.: US 6,970,126 B1
(45) Date of Patent: Nov. 29, 2005

(54) VARIABLE CAPACITANCE SWITCHED CAPACITOR INPUT SYSTEM AND METHOD

(75) Inventors: John O'Dowd, Limerick (IE); Damien McCartney, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/876,883

(22) Filed: Jun. 25, 2004

(51) Int. Cl.[7] .............................................. H03M 1/12
(52) U.S. Cl. ..................... 341/172; 341/143; 341/155
(58) Field of Search ............................ 341/172, 143, 341/155, 139, 152; 375/247; 327/341; 324/678; 73/724

(56) References Cited

U.S. PATENT DOCUMENTS

| | | | |
|---|---|---|---|
| 5,001,725 A * | 3/1991 | Senderowicz et al. ...... 375/247 |
| 5,134,401 A | 7/1992 | McCartney et al. | |
| 5,159,341 A | 10/1992 | McCartney et al. | |
| 5,323,158 A | 6/1994 | Ferguson, Jr. | |
| 5,479,130 A * | 12/1995 | McCartney ................. 327/341 |
| 5,659,254 A * | 8/1997 | Matsumoto et al. ........ 324/678 |
| 5,661,240 A * | 8/1997 | Kemp ..................... 73/514.32 |
| 6,316,948 B1 * | 11/2001 | Briefer ....................... 324/678 |
| 6,323,801 B1 * | 11/2001 | McCartney et al. ......... 341/172 |
| 6,452,521 B1 * | 9/2002 | Wang et al. ................. 341/139 |
| 6,509,746 B1 * | 1/2003 | Wang .......................... 324/678 |
| 6,674,383 B2 * | 1/2004 | Horsley et al. ............. 341/152 |
| 6,684,711 B2 * | 2/2004 | Wang ........................... 73/724 |

OTHER PUBLICATIONS

Hagleitner et al., CMOS Single-Chip Gas Detection System Comprisining Capacitive, Calorimetric and Mass-Sensitive Microsensors, IEEE Journal of Solid-State Circuits, vol. 37, No 12 (Dec. 2002).

* cited by examiner

Primary Examiner—Jean Bruner Jeanglaude
(74) Attorney, Agent, or Firm—Iandiorio & Teska

(57) ABSTRACT

A variable capacitance switched capacitor input system and method includes a differential integrator circuit having first and second input summing nodes and a variable sensing capacitor; one terminal of the variable sensing capacitor is connected to one of the nodes in the first phase and to the other of the nodes in the second phase; an input terminal connected to a second terminal of the variable sensing capacitor receives a first voltage level in the first phase and a second voltage level in the second phase for delivering the charge on the variable sensing capacitor to the first summing node in the first phase and to the second summing node in the second phase and canceling errors in a differential integrator circuit output caused by leakage current.

19 Claims, 10 Drawing Sheets

VARIABLE CAPACITANCE SWITCHED CAPACITOR INPUT SYSTEM AND METHOD

FIELD OF THE INVENTION

This invention relates to an improved variable capacitance switched capacitor input system and method, especially one which is leakage current insensitive and more particularly to such a system for a sigma delta modulator system.

BACKGROUND OF THE INVENTION

Conventional switched capacitor input systems, such as for integrator circuits in sigma delta modulators, employ a reference voltage, reference capacitor and input capacitor to determine an unknown input voltage. A switching system applies the reference voltage to charge the reference capacitor and the input voltage to charge the input capacitance in a first phase, then transfers those charges to a summing node of the integrator circuit in a second phase. At the end of the second phase the integrator output reflects the sum of the input and reference charge. The output of the integrator circuit resulting from that action is delivered to a comparator. At the end of the second phase the capacitor is clocked and provides at its output one level or another 1 or 0, which is fed back to control whether the reference voltage applied to the reference capacitor should be positive or negative. The average of the 1's and 0's over time is thus a representation of the unknown input voltage.

A variation of that approach employs a differential integrator with two input capacitors that receive positive and negative unknown input voltages and two reference capacitors to obtain a mutual offsetting of any errors in the on-chip circuitry. A further improvement modifies the switching circuit in order to operate the system on a single polarity reference voltage U.S. Pat. No. 5,323,158, Switched Capacitor One-Bit Digital-to-Analog Converter, Paul F. Ferguson. One example of this is to add another level of switching to alternately effect the charge transfer between the reference capacitors and selective ones of the positive and negative summing nodes of the differential integrator circuit.

In a further improvement that increases efficiency by operating fully in both phases, the input capacitors are connected to alternative summing nodes in each phase. This achieves charge transfer from the input capacitors to the integrator capacitors in both phases instead of in the one phase only.

An alternative application of switched capacitor input sigma delta modulators is as capacitive sensing devices where the input voltage is now known and the capacitance is variable and unknown. In that application the 1, 0 comparator output of the modulator represents the value of the unknown capacitance.

One shortcoming of these devices is that unknown variable capacitance in practical applications frequently suffers from leakage current which introduces error into the capacitance determination. This is particularly a problem when the unknown capacitance is remote e.g. off-chip.

BRIEF SUMMARY OF THE INVENTION

It is therefore an object of this invention to provide an improved variable capacitance switched capacitor input system and method.

It is a further object of this invention to provide an improved variable capacitance switched capacitor input system and method for a sigma delta modulator or charge amplifier application.

It is a further object of this invention to provide an improved variable capacitance switched capacitor input system and method which is leakage current insensitive.

The invention results from the realization that an improved variable capacitance switched capacitor input system and method which is leakage current insensitive such as for a charge amplifier or for an integrator circuit such as used in a sigma delta modulator can be effected using a variable sensing capacitor which is connected to one node of an integrating circuit or charge amplifier in one phase and to the other node in a second phase while the other end of the capacitor receives a first voltage level in one phase and a second voltage level in the other phase in order to transfer charge between the capacitor and integrator circuit and cancel leakage current errors in the output of the integrator circuit/charge amplifier.

This invention features a variable capacitance switched capacitor input system including a differential integrator circuit having first and second input summing nodes and a variable sensing capacitor. A switching system connects one terminal of the variable sensing capacitor to one of the nodes in the first phase and to the other of the nodes in the second phase. A second terminal of the variable sensing capacitor receives a first voltage level in the first phase and a second voltage level in the second phase for transferring the charge on the variable sensing capacitor to the first summing node in the first phase and to the second summing node in the second phase and canceling errors in a differential integrator circuit output caused by leakage current.

In a preferred embodiment the integrator circuit may include a reset circuit for periodically resetting the integrator circuit. There may be a bilevel voltage source for providing the first and second voltage levels. The integrator circuit may be a part of a sigma delta converter or modulator. There may be a reference capacitor, a bilevel reference voltage source having first and second reference voltage levels and a second switching system for connecting to a first terminal of the reference capacitor a first reference voltage level in the first state and a second reference voltage level in the second state and for connecting to the second terminal of the reference capacitor to one of the summing nodes in the first state and to the other of the summing nodes in the second state for transferring the reference capacitor charge to the integrator circuit in both states. The variable sensing capacitor may be remote from the switching system and the integrator circuit. The variable sensing capacitor and the switching system and the integrator circuit may be on a single chip. The first and second phases may be nominally equal as may the integrator capacitors in the differential integrator circuit.

The invention also features a variable capacitance switched capacitor input system including a differential integrator circuit having first and second input summing nodes and first and second variable sensing capacitors. First and second switching systems are associated with the first and second variable sensing capacitors, respectively. Each switching system connects one terminal of its associated variable sensing capacitor to one of the nodes in the first phase and to other of the nodes in the second phase. Each variable sensing capacitor having a second terminal for receiving a first voltage level in the first phase and the second voltage level in the second phase for transferring the charge on the associated variable sensing capacitor to one summing node on the first phase and to the other summing node on the second phase and canceling errors in a differential circuit output caused by leakage current.

In a preferred embodiment the switching system may connect the one terminal of its associated variable sensing capacitor to the same one of the nodes in the first phase and to the same other of the nodes in the second phase. Or it may connect the one terminal of its associated variable sensing capacitor to a different one of the nodes in the first phase and swap them to the other nodes in the second phase.

The invention also features a variable capacitance switched input system including a differential integrator circuit having first and second input summing nodes and first and second variable sensing capacitors. There are first and second switching systems associated with the first and second variable sensing capacitors, respectively. Each switching system connects one terminal of its associated variable sensing capacitor to one of the nodes in the first phase and to the other of the nodes in the second phase. Each variable sensing capacitor may have a shared second terminal for receiving a first voltage level in the first phase and second voltage level in second phase for transferring the charge in the associated variable sensing capacitor to one summing node in the first phase and the other summing node in the second phase and canceling leakage current error in each phase of the differential circuit output.

The invention also features a variable capacitance switch capacitor sigma delta modulator system including a differential integrator circuit having first and second input summing nodes and a variable sensing capacitor. There is a switching system for connecting one terminal of the variable sensing capacitor to one of the nodes of the first phase and to the other of the nodes in the second phase. A second terminal of the variable sensing capacitor receives a first voltage level in the first phase and second voltage level in the second phase for transferring the charge on the variable sensing capacitor to the first summing node in first phase and to the second summing node on the second phase and canceling leakage current errors in the differential circuit output.

The invention also features a variable capacitance switch capacitor sigma delta modulator system including a differential integration circuit having first and second integrator circuits having first and second input summing nodes and first and second variable sensing capacitors. There are first and second switching systems associated with the first and second variable sensing capacitors respectively. Each switching system connects one terminal of its associated variable sensing capacitor to one of the nodes in the first phase and to the other of the nodes in the second phase. Each variable sensing capacitor having a second terminal for receiving a first voltage level in the first phase and a second voltage level in the second phase for transferring the charge on the associated variable sensing capacitor to one summing node on the first phase and to the other summing node on the second phase and canceling leakage current errors in the differential circuit output.

In a preferred embodiment each switching system may connect one terminal of its associated variable sensing capacitor to the same one of the nodes in the first phase and to the same other of the nodes in the second phase. Each switching system may connect one terminal of its associated variable sensing capacitor to a different one of nodes in the first phase and swap them to the other nodes in the second phase.

This invention also features a variable capacitance switched capacitor sigma delta modulator system including a differential integrator circuit having first and second input summing nodes; first and second variable sensing capacitors, and first and second switching systems associated with the first and second variable sensing capacitors, respectively, each switching system connecting one terminal of its associated variable sensing capacitor to one of the nodes in a first phase and to the other of the nodes in a second phase. The variable sensing capacitors may have a shared or common second terminal for receiving a first voltage level in the first phase and a second voltage level in the second phase for transferring the charge on the associated variable sensing capacitor to one summing node in the first phase and to the other summing node in the second phase and canceling errors in the differential circuit output caused by leakage current.

This invention also features a switching method for a variable capacitance switched capacitor input system having a differential integrator circuit having first and second input summing nodes and a variable sensing capacitor. One terminal of the variable sensing capacitor is connected to one of the nodes in a first phase and to other of the nodes in a second phase and a first voltage level is applied to the second terminal of the variable sensing capacitor in the first phase and a second voltage level is applied to it in the second phase for transferring the charge on the variable sensing capacitor to the first summing node in the first phase and to the second summing node in the second phase and canceling errors in the differential integrator circuit output caused by leakage current.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
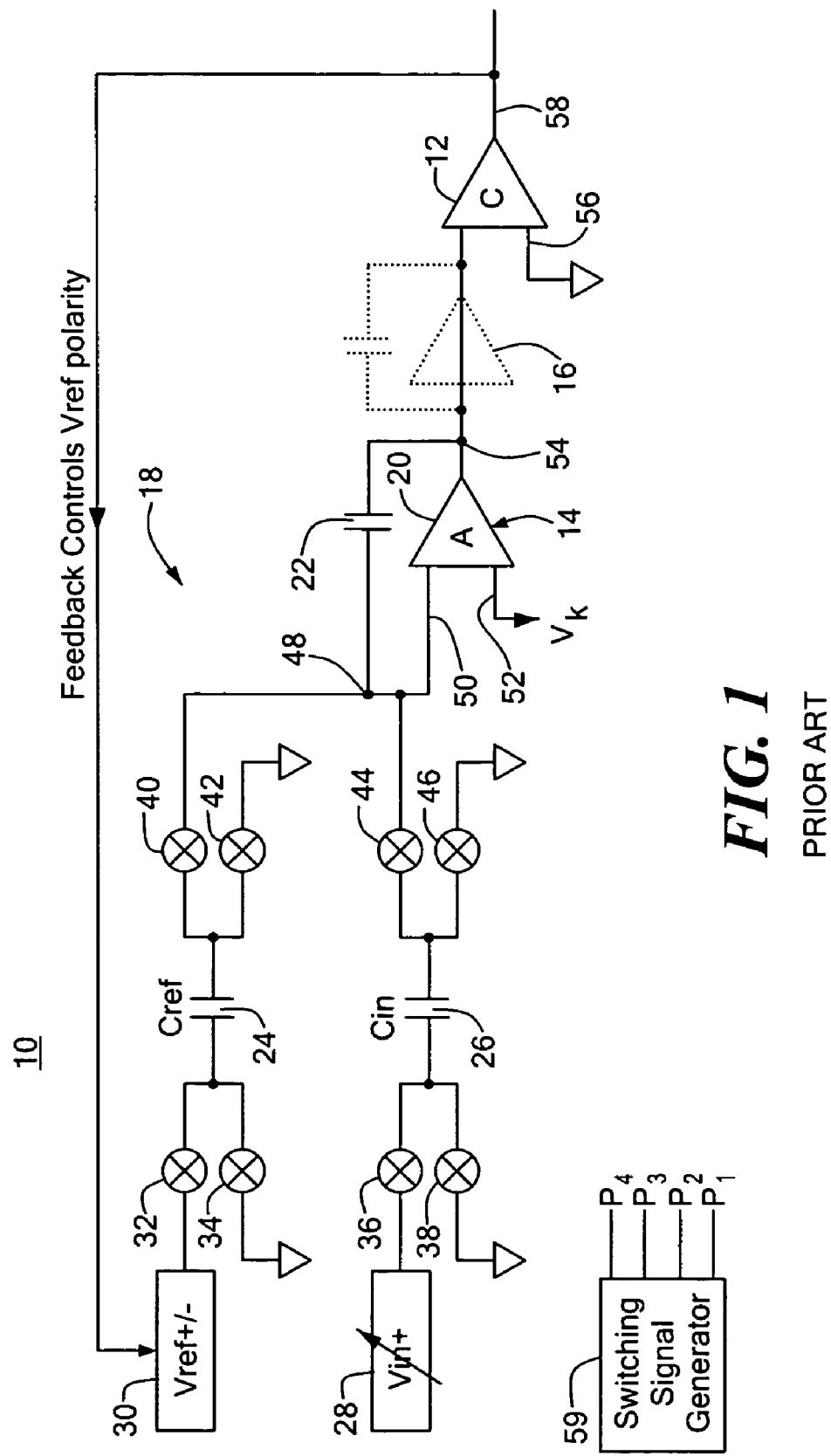
FIG. 1 is a schematic diagram of a prior art switched capacitor input sigma delta modulator system for detecting an unknown input voltage.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a prior art circuit including sigma delta modulator 10, including comparator 12 one or more integrators 14, 16 and a switched capacitor system 18. Each integrator 14, 16 et seq. has its own switched capacitor system associated with it, though only switched capacitor system 18 associated with integrator 14 is shown for simplicity. Integrator 14 includes amplifier 20 and feedback capacitor 22. Switched capacitor system 18 includes reference capacitor 24 and input capacitor 26. There is a source 28 of input voltage Vin+ and a source 30 of positive and negative reference voltages Vref+, Vref−. The switched capacitor system 18 also includes a number of switches 32, 34, 36, 38, 40, 42, 44, and 46. The system operates in two phases, in phase one Vref+ is connected to switch 32 to charge reference capacitor 24 through switch 42 to ground. In phase two switch 34 connects one side of reference capacitor 24 to ground and switch 40 connects the other side to the summing node 48 of integrator 14. Similarly, input capacitor 26 is connected to Vin+ from source 28 through switch 36 and to ground through switch 46 in phase one. In phase two ground is applied through switch 38 to one side of input capacitor 26, the other side of which is connected through switch 44 to summing node 48 of integrator 14. Thus in phase two there is a charge transfer between reference capacitor 24 and integrator capacitor 22 and between input capacitor 26 and integrator capacitor 22. The summation of those two charges at node 48 causes an imbalance between input 50 and input 52 of integrator amplifier 20. Amplifier 20 moves immediately to balance those inputs 50, 52 causing a voltage to appear on its output 54. That output causes comparator 12 to output either a one or a zero depending upon whether that voltage input is more or less than the reference input 56 $V_k$. The output 58 of comparator 12 controls the reference voltage source 30 as to whether it provides Vref+ or Vref−. A one at output 58 causes Vref− to be applied to switch 32 to charge reference capacitor 24, while a zero would cause Vref+ to be applied through switch 32 to charge reference capacitor 24 according to the usual operation of a sigma delta modulator. The base signals for both phases are generated by a switching signal generator 59 which generates the phase switching signals P1 and P2 and may generate additional signals P3, P4 as necessary. In actual operation the switches that are operated in any particular phase, for example, switches 36 and 46, may not be operated at exactly the same moment, e.g., it can be advantageous to open switch 46 in advance of switch 36 for reduction of charge injection. This is a technique that is well known in the art and can be applied throughout the rest the embodiments both prior art and those according to this invention shown throughout the specification.

Figure 2:
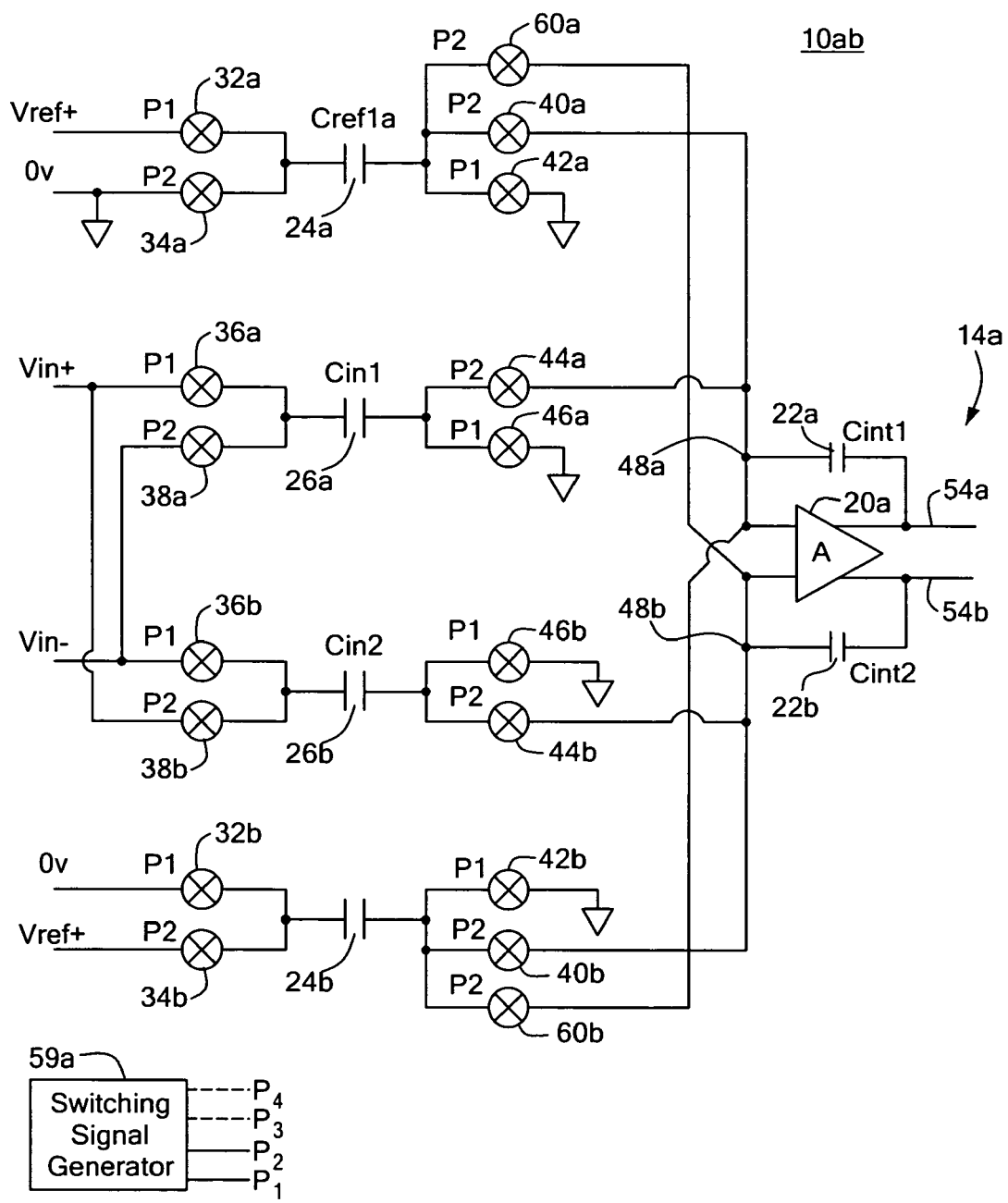
FIG. 2 is a schematic diagram of a prior art more efficient, differential switched capacitor input sigma delta modulator system for detecting an unknown input voltage.

One improvement on the prior art system of FIG. 1, employs a differential integrator system where the input and reference channels are duplicated as shown in the prior art circuit of FIG. 2 in order to provide cancellation of mutual or common source errors such as charge injection. Here there are two input capacitances 26a and 26b, each with its own associated set of switches 36a, 38a, 44a, 46a and 36b, 38b, 44b and 46b, respectively. Thus, in phase one, in this way, input capacitor 26a is being charged to Vin+ through switches 36a and 46a. Input capacitor 26b is being charged to Vin− through switches 36b and 46b. In phase two input capacitor 26a is connected through switches 38a and 44a to summing node 48a and input capacitor 26b is connected through switches 38b and 44b to summing node 48b. There are also two reference capacitors 24a and 24b. In phase one capacitor 24a is charged to Vref+ through switches 32a and 42a. Reference capacitor 24b is charged to zero through switch 32b and switch 42b in phase one and in phase two is discharged through switch 34b and switch 40b through node 48b. By adding another switch 60a associated with reference capacitor 24a, a choice can be made in phase two as to which node 48a or 48b the capacitor should be discharged to. This has the effect of allowing either a positive or negative charge transfer to appear on the integrator output without actually requiring a Vref+ and a Vref− and thus this system can operate with a reference of single polarity. Similar structure including switch 60b is associated with reference capacitor 24b with the same effect. A more efficient prior art structure, FIG. 3, includes a second reference capacitor 24cc and another reference capacitor 24dd which have associated with them switches 70cc, 72cc, 74cc, 76cc and 70dd, 72dd, 74dd, and 76dd, respectively. Also associated with them are switches 78cc and 78dd so that those capacitors, too, can be selectively connected to nodes 48c and 48d to transfer charge into or out of integrator 20c in the same way as switches 60c and 60b. In this way reference capacitor 24c charges in phase one and transfers its charge in phase two, while reference capacitor 24cc transfers its charge in phase one and charges in phase two. The same is true with reference to capacitors 24d and 24dd. By transferring charge in both phases the efficiency of the integrator is increased since it is operating in both phases. Charge transfer in both phases on the input capacitors 26c and 26d can also be accomplished by connecting switches 46c and 46d directly to nodes 48d and 48c, respectively, so that charge transfer occurs in both phases from the input capacitance to nodes 48c and 48d as disclosed in Ferguson U.S. Pat. No. 5,323,158. With the addition of switches 60c and 60d the use of switches 42c and 42d can be eliminated as taught by Ferguson U.S. Pat. No. 5,323,158. Both switches 40c and 40d or 60c and 60d operate in both phases connecting alternatively to summing nodes 48c and 48d. The sequence of which summing node is connected on which phase depends upon the comparator output.

Figure 3:
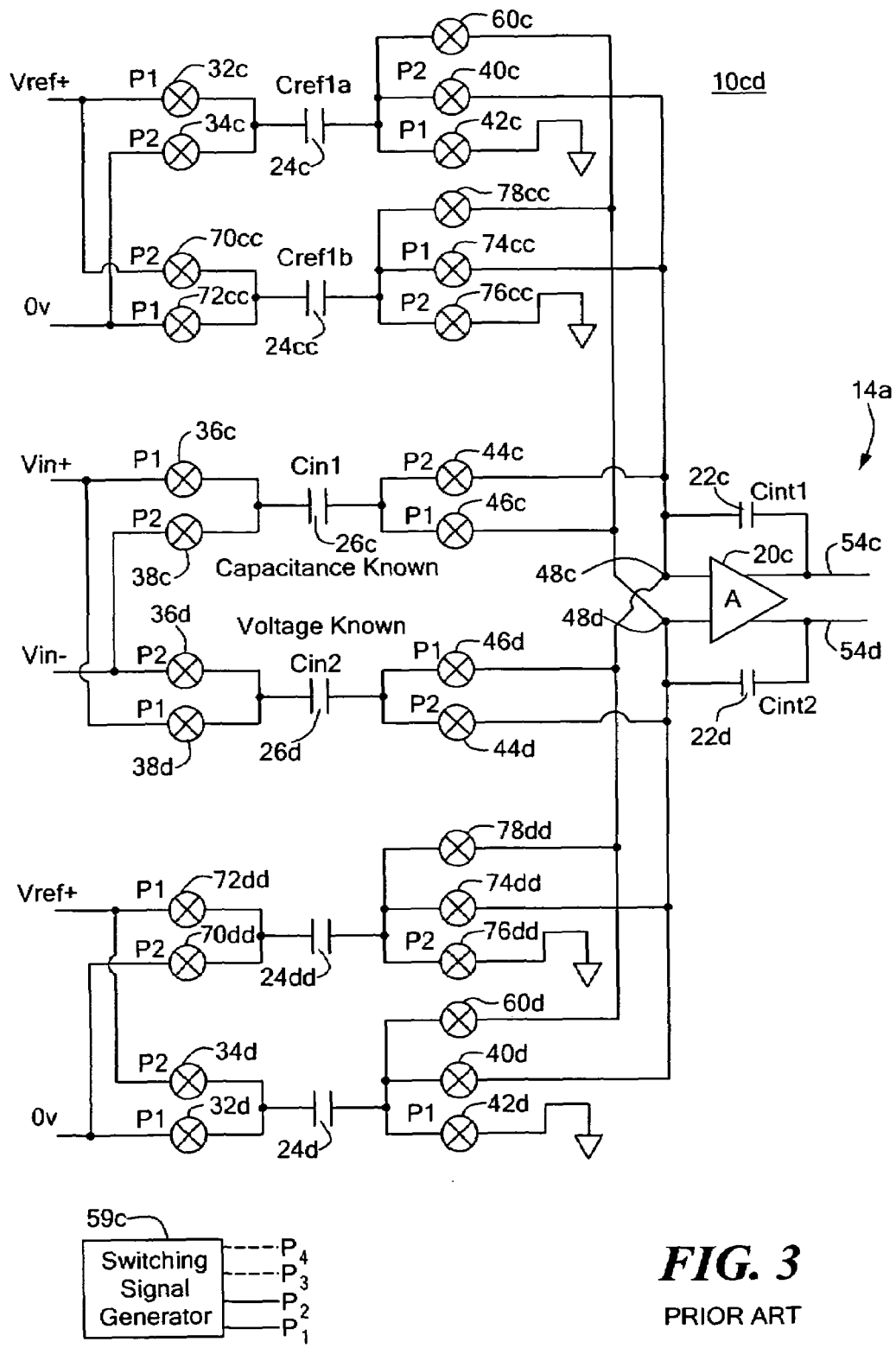
FIG. 3 is a schematic diagram of another prior art switched capacitor input sigma delta modulator system for detecting an unknown input voltage.

In FIGS. 1, 2 and 3 the sigma delta modulator output produced a representation of the unknown input voltage. The output can also be representative of an unknown variable capacitance 90 in the place of the input capacitor 26 if the input voltage is known. Such a prior art circuit is shown at 10e, FIG. 4, where the input voltage is provided either by a square wave 80 which is high 82 in phase one and low 84 in phase two or can be accomplished by providing a high voltage $V_H$ through a switch 86 operated in phase one and a low voltage $V_L$ through switch 88 operated in phase two. The bilevel voltage 80 or the switched bilevel voltage $V_H$, $V_L$ obtained through switches 86 and 88 charge the unknown variable capacitor 90 through switch 46e in phase one and then applies the charge to the integrator 14e in phase two through switch 44e.

Figure 4:
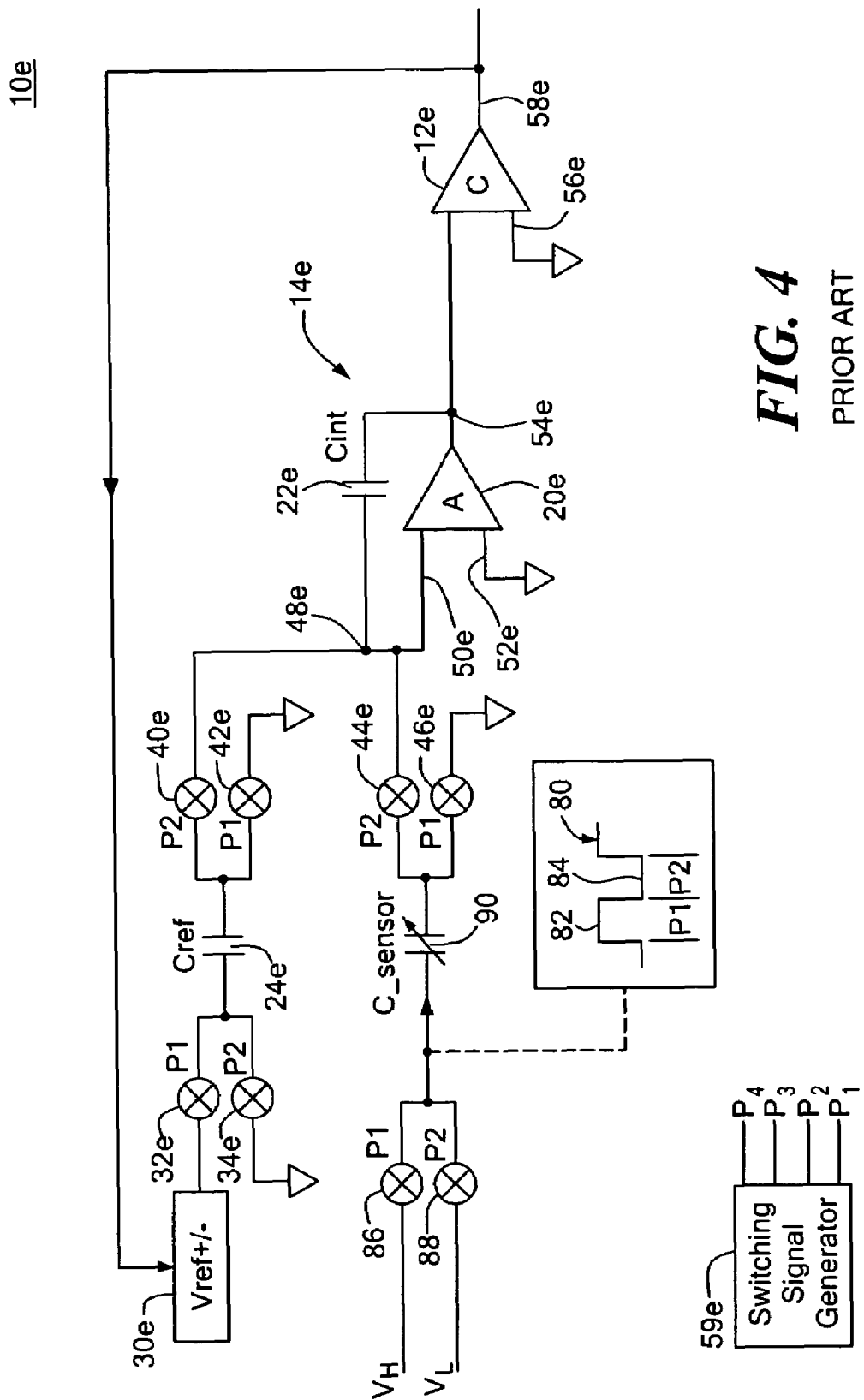
FIG. 4 is a schematic diagram of another prior art switched capacitor input sigma delta modulator system for detecting an unknown input capacitance.
Figure 5:
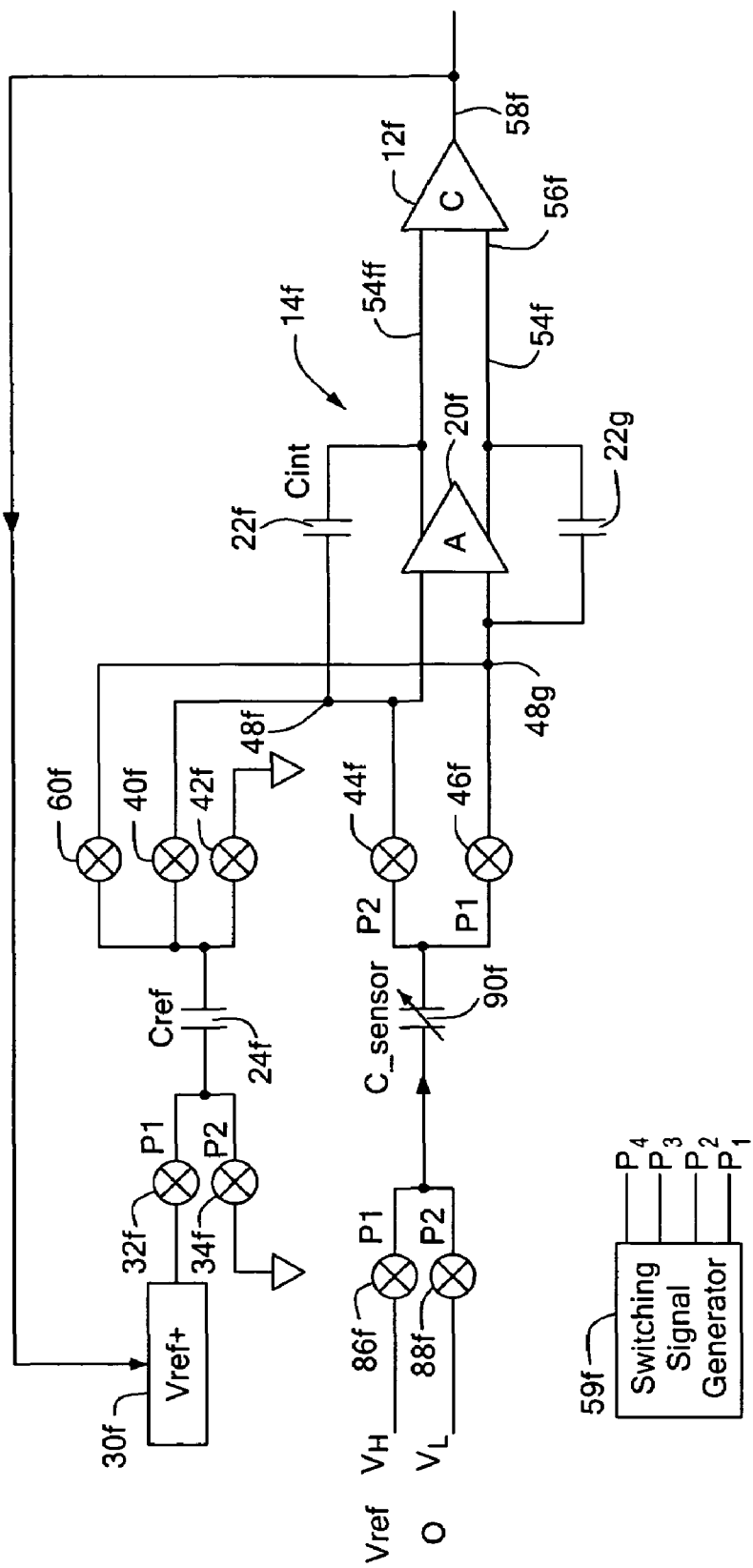
FIG. 5 is a schematic diagram of a leakage current insensitive variable capacitance switched capacitor input sigma delta modulator system for detecting an unknown input capacitance according to this invention.

In accordance with this invention system 10f, FIG. 5, employs a differential integrator 14f so that switch 46f connects input capacitance 90f not to ground as in the prior art, FIG. 4, but directly to summing node 48g of integrator 14f. Switch 44f still connects variable capacitance 90f to node 48f. Also in this invention there can be added the reference capacitance 24f which has associated with it similar switches 32f, 34f, 40f, and 42f and an additional switch 60f as previously explained. The selective charging and discharging of capacitor 24f enables the system to work with Vref+ instead of Vref+ and Vref−. Further as previously taught switch 42f can be eliminated and switches 60f and 40f may be connected in both phases one and two to selective ones of summing nodes 48f and 48g in dependence upon the output of comparator 12f. The excitation of sensor 90f is as explained with respect to FIG. 4, either a high level $V_H$ and low level $V_L$ voltage alternated through switches 86f and 88f or a square wave 80 as shown in FIG. 4. So long as the voltage is known the variable capacitance 90f can be unknown and represented finally by the output 58f of comparator 12f.

Figure 6:
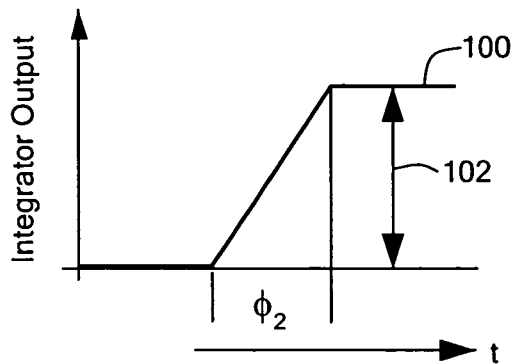
FIG. 6 illustrates the occurrence of leakage current in a single sided system.
Figure 7:
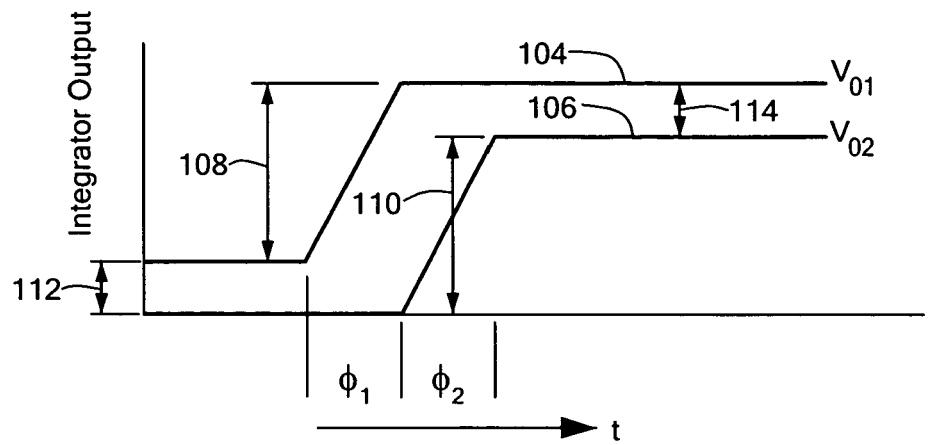
FIG. 7 illustrates the occurrence of leakage current in a differential system.

The connection of capacitor 90f though switch 46f to summing node 48g instead of ground makes the system leakage insensitive. For example as shown in FIG. 6, in a single-sided integrator the integrator output 100 would increase as result of the leakage current and produce a leakage error 102 which would interfere with the accurate measurement of the variable sensor 90f. However, in this invention, as shown in FIG. 7, using a differential integrator there are two outputs, 104 and 106 wherein the difference between them is the signal of interest; there it can be seen that the output 104 shows a delta due to leakage 108 while the output 106 shows an equal delta due to leakage 110. Since both outputs 104 and 106 are increased by the same amount the differential output of interest 112 has not changed and is the same as the final integrator output 114 because the two deltas are equal and track one another. This explanation assumes a zero input for ease of explanation. In order to balance the deltas due to leakage 108 and 110 the phases $\phi_1$, $\phi_2$ should be kept approximately equal e.g. for a clock period of 20 μsec, $\phi_1$ and $\phi_2$ would be approximately 10 μsec, and integrator capacitor 22f and 22g should be approximately equal too, e.g. if reference capacitor 24f is 1pf then capacitors 22f and g would be in the range of 5–20pf.

The switching method of this invention makes for a leakage current insensitive variable capacitance switched capacitor input using a differential integrator circuit having first and second input summing nodes, a variable sensing capacitor and an input terminal connected to a second terminal of the variable sensing capacitor. One terminal of the variable sensing capacitor is connected to one of the nodes in a first phase and to the other of the nodes in a second phase. A first voltage is applied to the input terminal in the first phase and a second voltage level in the second phase for transferring the charge on the variable sensing capacitor to the first summing node in the first phase and to the second summing node in the second phase and canceling errors in the differential integrator circuit output caused by the leakage current.

Figure 8:
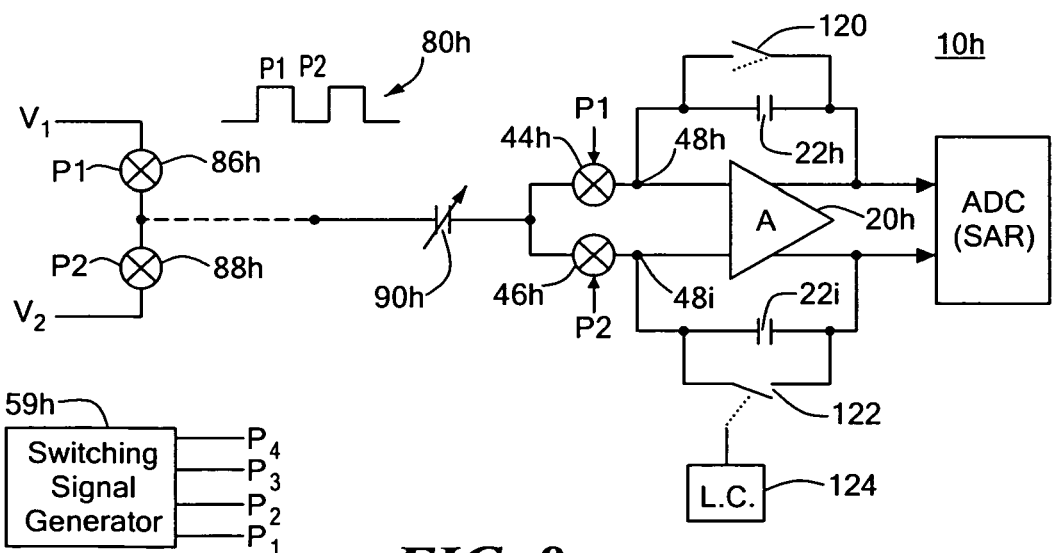
FIG. 8 is a schematic block diagram of a leakage current insensitive variable capacitance switched capacitor input according to this invention for a charge amplifier.

Although thus far the switching system of this invention to effect the improved leakage insensitive variable capacitor sensor has been demonstrated with respect to a sigma delta modulator system this is not a necessary limitation of the invention. As shown in FIG. 8, the integrator can be used as a charge amplifier which, for example, provides an input to another ADC, for example of SAR, (Successive Approximation Register) architecture. All that is needed in that case is to replace the comparator with a SAR ADC and to short out the capacitors 22h, 22i by, for example, switches 120, 122, and periodically resetting them in response to control signals from a logic circuit 124.

Figure 9:
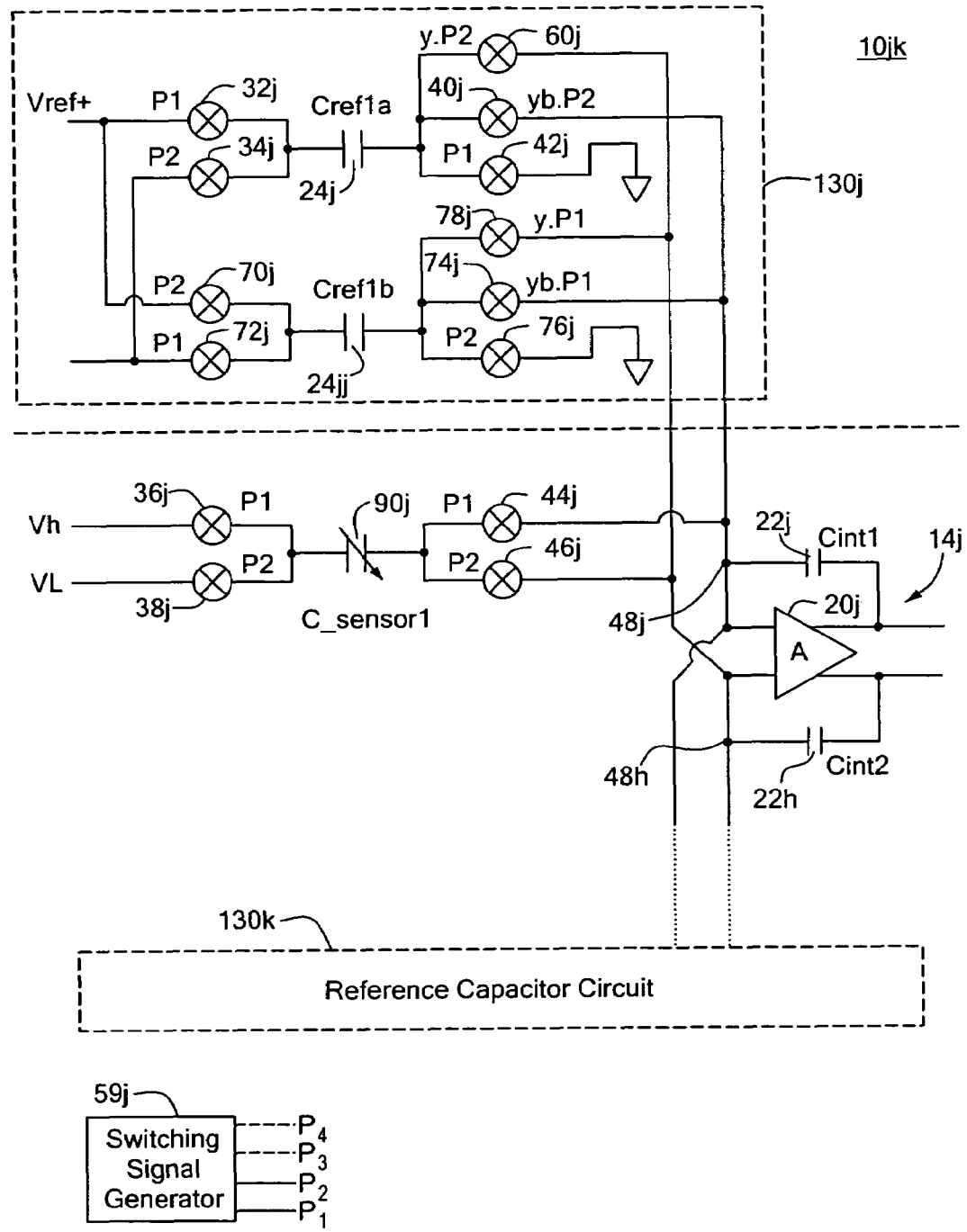
FIGS. 9 and 10 are alternative constructions of the leakage insensitive variable capacitance switched capacitor input system of this invention which effect different solutions of the variable capacitance.

The variable capacitor sensing system according to this invention can be used with a fully differential circuit by duplicating the reference capacitor circuit 130j, FIG. 9, with an identical mirror image circuit 130k to provide the advantages of canceling the charge injection errors. The differential operation also enables the system to work in both phases to obtain the power efficiencies as explained with respect to the previous prior art figures. The calculation of unknown capacitance 90j, FIG. 9, is a function of the ratio of sensor capacitor 90j to reference capacitors 24j, 24jj, 24k, and 24kk.

Figure 10:
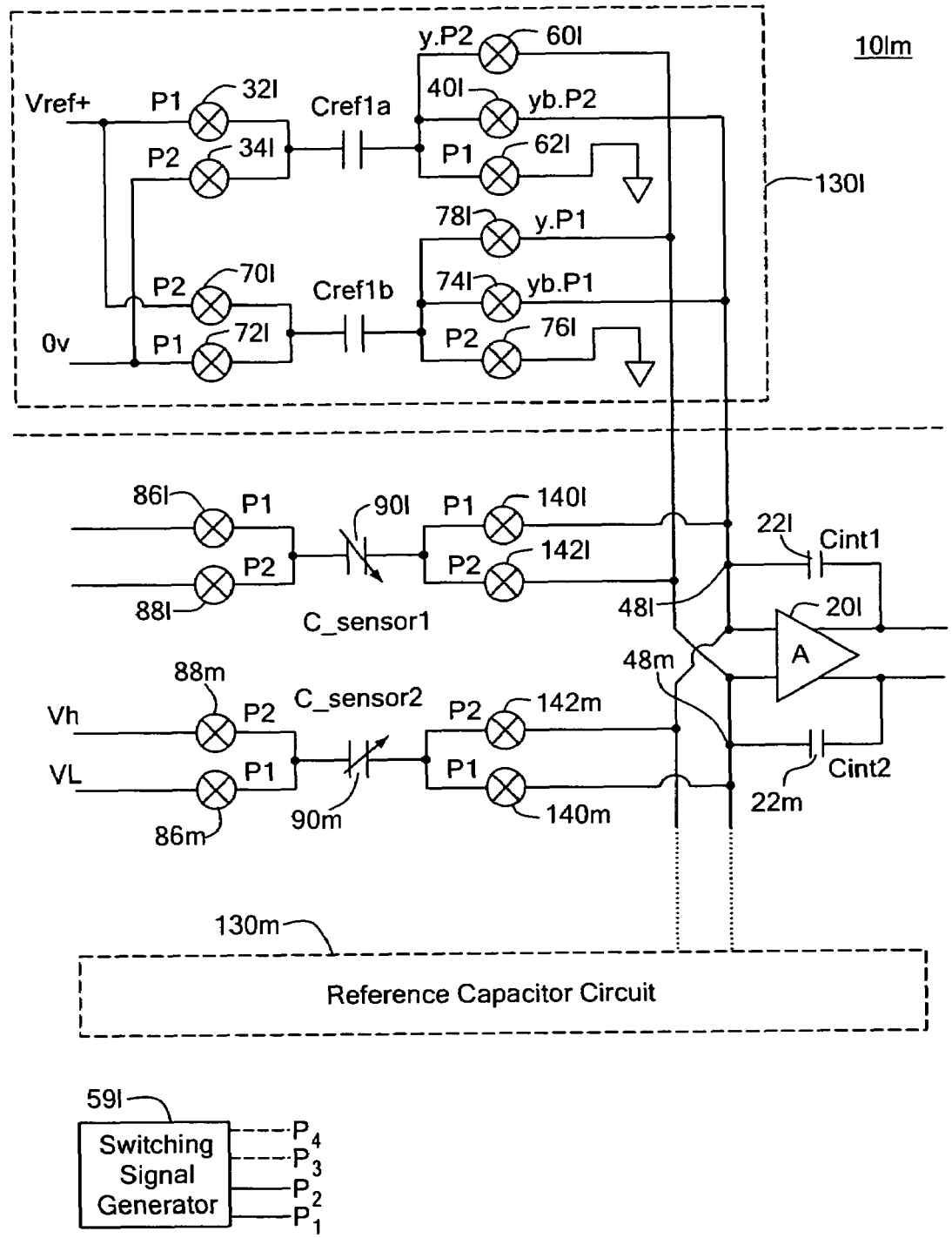

This system can be arranged according to this invention using two sensor capacitors to provide the unknown capacitive value as proportion of the two sensor capacitors divided by the reference capacitors as shown in FIG. 10, where there are two sensor capacitors 90l, 90m. In phase one, switch 86l applies $V_H$ to capacitor 90l and connects capacitor 90l through switch 140l to summing node 48l while switch 86m connects $V_L$ to capacitor 90m and though switch 140m to summing node 48m. In phase two $V_L$ is connected though switch 88l to capacitor 90l and through switch 142l to summing node 48m while switch 88m connects $V_H$ to capacitor 90m and connects it through switch 142m to node 48l. In this way the output of the integrator and ultimately the digital stream will represent the capacitance in proportion to capacitor 90l plus capacitor 90m divided by the sum of the reference capacitances.

Although thus far the description illustrates that the variable capacitors are switched oppositely, that is when one capacitor is connected to one node, the other capacitor is switched to the other node, this is not a limitation of the invention. For example, in FIG. 10, switches 140l and 142m could connect their respective capacitors 90l, 90m to node 48l at the same time and then subsequently switches 142l and 140m could connect those capacitors together to node 48m. In this way the output of the integrator and ultimately the digital stream will represent the capacitance in proportion to capacitor 90l minus capacitor 90m divided by the sum of the reference capacitances.

An alternative to FIG. 10 which would give an output proportional to the difference between capacitor 90l and 90m would be to use switch 88m in phase one and 86m in phase two, all other switches acting as before.

Figure 11:
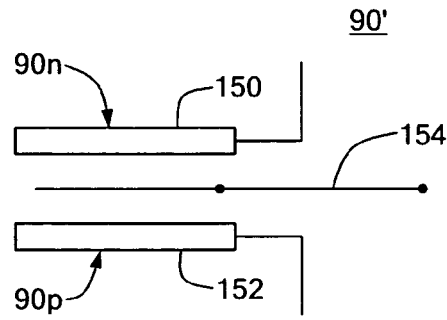
FIG. 11 is a schematic illustration of a common electrode capacitor.
Figure 12:
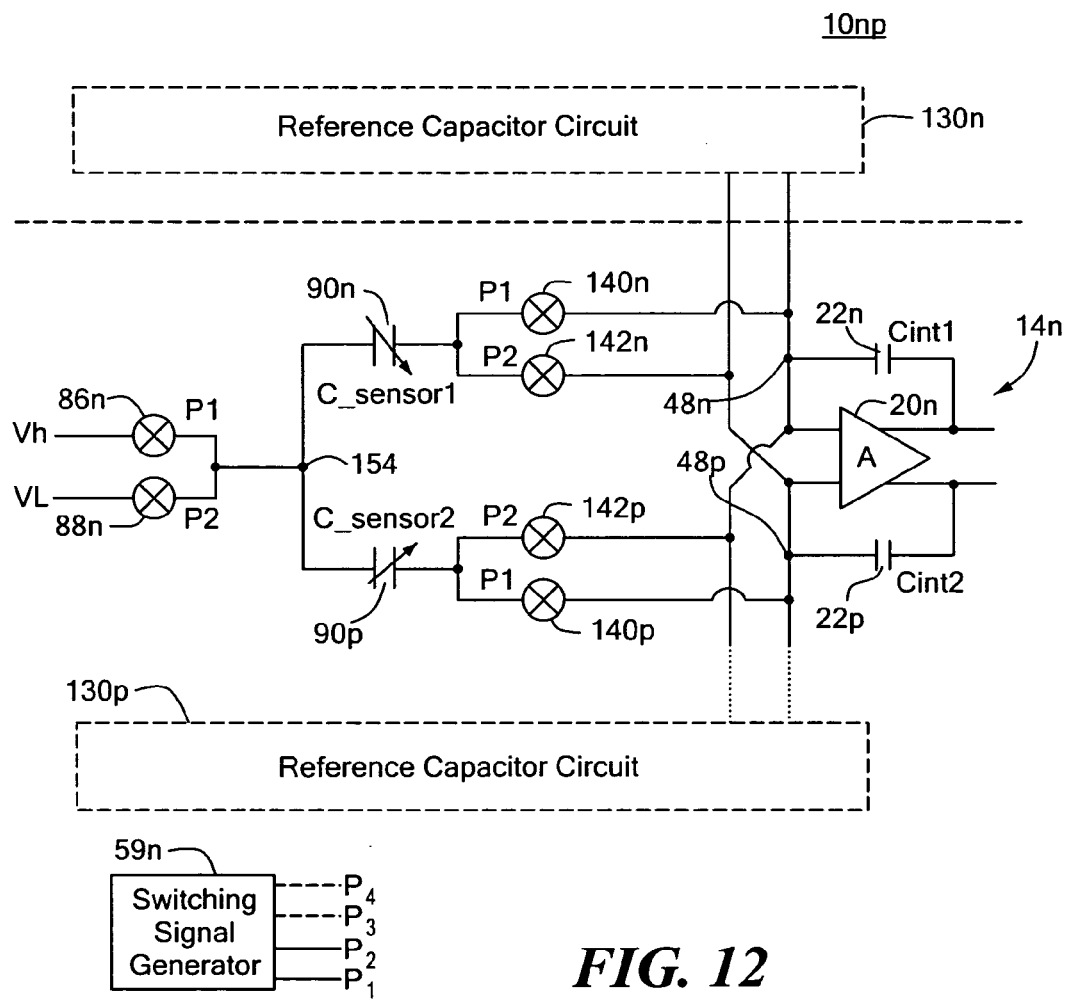
FIG. 12 is a construction of the leakage insensitive variable capacitance switched capacitor input system of this invention which accommodates the capacitor construction of FIG. 11.

In some instances the sensing capacitor structure may have two capacitances in a single structure as shown in FIG. 11, where capacitor 90' includes two capacitors 90n, 90p that include two fixed electrodes 150, 152 and one common center electrode 154. To accommodate this structure terminal 154 is connected directly to switches 86n, 88n, FIG. 12. Capacitor 90n is connected through switches 140n and 142n alternately to summing nodes 48n and 48p, and similarly capacitor 90p is connected through switches 140p and 142p alternately to summing nodes 48p and 48n. This provides an output representing the value of the unknown variable capacitances 90n, 90p as a function of the difference between 90n and 90p divided by the sum of the reference capacitances.

Figure 13:
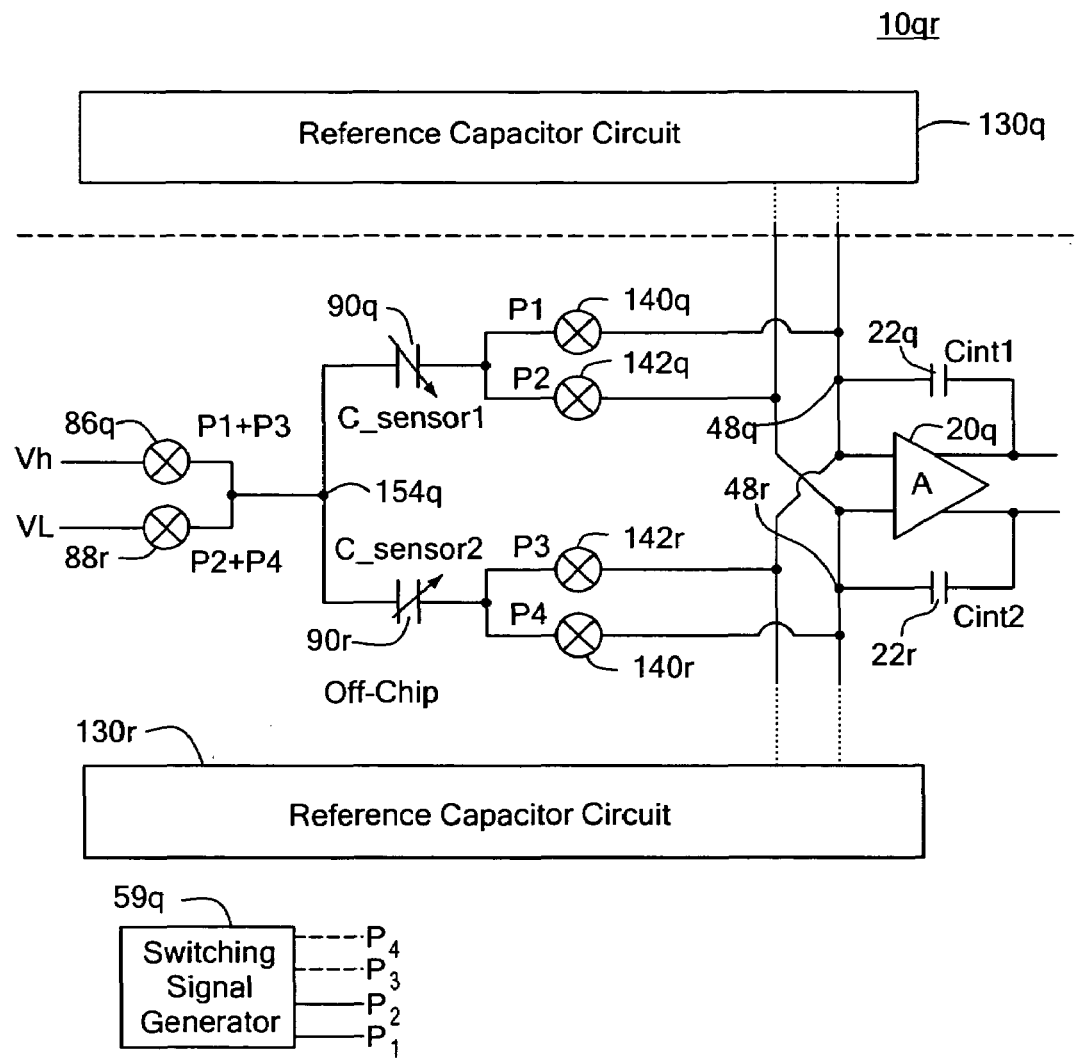
FIG. 13 is another alternative construction of the leakage insensitive variable capacitance switched capacitor input system of this invention which effects yet another solution of the variable capacitance.

The unknown capacitance may be expressed as a function of the two capacitors added together divided by the reference capacitor in the configuration as shown in FIG. 13, where switching signal generator 59q provides four phases, P1, P2, P3, and P4 then the high voltage $V_H$ is provided by switch 86$q$ in phases one and three to capacitors 90$q$ and 90$r$ and the low voltage is provided by switch 86$r$ in phases two and four to capacitors 90$q$ and 90$r$. In phase one capacitor 90$q$ is connected by switch 140$q$ to summing node 48$q$ while in phase two it is connected by switch 142$q$ to summing node 48$r$. Capacitor 90$r$ is connected in phase three by switch 142$r$ to summing node 48$q$ and in phase four by switch 140$r$ to summing node 48$r$.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A variable capacitance switched capacitor input system comprising:
   a differential integrator circuit having first and second input summing nodes;
   a variable sensing capacitor;
   a switching system for connecting one terminal of said variable sensing capacitor to one of said nodes in a first phase and to the other of said nodes in a second phase; and
   a second terminal of said variable sensing capacitor for receiving a first voltage level in said first phase and a second voltage level in said second phase for transferring the charge on said variable sensing capacitor to said first summing node in said first phase and to said second summing node in said second phase and canceling errors in the differential integrator circuit output caused by leakage current.

2. The variable capacitance switched capacitor input system of claim 1 in which said integrator circuit includes a reset circuit for periodically resetting said integrator circuit.

3. The variable capacitance switched capacitor input system of claim 1 further including a bilevel voltage source for providing said first and second voltage levels.

4. The variable capacitance switched capacitor input system of claim 1 in which said integrator circuit is in a sigma delta converter.

5. The variable capacitance switched capacitor input system of claim 1 further including
   a reference capacitor,
   a bilevel reference voltage source having first and second reference voltage levels and a second switching system for connecting to a first terminal of said reference capacitor,
      a first reference voltage level in a first state and
      a second reference voltage level in a second state, and
   for connecting the second terminal of said reference capacitor to one of said summing nodes in said first state, and the other of said summing nodes in said second state,
   for transferring the reference capacitor charge to said integrator circuit in both states.

6. The variable capacitance switched capacitor input system of claim 1 in which said variable sensing capacitor is remote from said switching system and said integrator circuit.

7. The variable capacitance switched capacitor input system of claim 1 in which said variable sensing capacitor, said switching system and said integrator circuit are on a single chip.

8. The variable capacitance switched capacitor input system of claim 1 in which said first and second phases are of approximately equal duration.

9. The variable capacitance switched capacitor input system of claim 1 in which said differential integrator circuit includes two capacitors and they are approximately equal.

10. A variable capacitance switched capacitor input system comprising:
    a differential integrator circuit having first and second input summing nodes;
    first and second variable sensing capacitors;
    first and second switching systems associated with said first and second variable sensing capacitors, respectively, each said switching system connecting one terminal of its associated variable sensing capacitor to one of said nodes in a first phase and to the other of said nodes in a second phase; and
    each said variable sensing capacitor having a second terminal for receiving a first voltage level in said a first phase and a second voltage level in said second phase for transferring the charge on the associated said variable sensing capacitor to said one summing node in said first phase and to the other summing node in said second phase
    and canceling errors in each phase in the differential circuit output caused by leakage current.

11. The variable capacitance switched capacitor input of claim 10 in which each said switching system connects said one terminal of its associated variable sensing capacitor to the same one of said nodes in the first phase and to the same other of said nodes in the second phase.

12. The variable capacitance switched capacitor input of claim 10 in which each said switching system connects said one terminal of its associated variable sensing capacitor to a different one of said nodes in the first phase and swaps them to the other nodes in the second phase.

13. A variable capacitance switched capacitor input system comprising:
    a differential integrator circuit having first and second input summing nodes;
    first and second variable sensing capacitors;
    first and second switching systems associated with said first and second variable sensing capacitors, respectively, each said switching system connecting one terminal of its associated variable sensing capacitor to one of said nodes in a first phase and to the other of said nodes in a second phase; and
    each of said variable sensing capacitors having a shared second terminal for receiving
       a first voltage level in said first phase and a second voltage level in said second phase
    for transferring the charge on the associated said variable sensing capacitor to said one summing node in said first phase and to the other summing node in said second phase
    and canceling errors in each phase in the differential circuit output caused by leakage current.

14. A variable capacitance switched capacitor sigma delta modulator system comprising:
    a differential integration circuit having first and second input summing nodes;
    a variable sensing capacitor;

a switching system for connecting one terminal of said variable sensing capacitor to one of said nodes in a first phase and to the other of said nodes in a second phase; and a second terminal of said variable sensing capacitor for receiving a first voltage level in said first phase and a second voltage level in said second phase for transferring the charge on said variable sensing capacitor to said first summing node in said first phase and to said second summing node in said second phase and canceling errors in the differential integrator circuit output caused by leakage current.

15. A variable capacitance switched capacitor sigma delta modulator system comprising:

a differential integrator circuit having first and second input summing nodes;

first and second variable sensing capacitors;

first and second switching systems associated with said first and second variable sensing capacitors, respectively, each said switching system connecting one terminal of its associated variable sensing capacitor to one of said nodes in a first phase and to the other of said nodes in a second phase; and each said variable sensing capacitor having a second terminal for receiving a first voltage level in said first phase and a second voltage level in said second phase for transferring the charge on the associated said variable sensing capacitor to said one summing node in said first phase and to the other summing node in said second phase and canceling errors in each phase in the differential circuit output caused by leakage current.

16. The variable capacitance switched capacitor sigma delta modulator system of claim 15 in which each said switching system connects said one terminal of its associated variable sensing capacitor to the same one of said nodes in the first phase and to the same other of said nodes in the second phase.

17. The variable capacitance switched capacitor sigma delta modulator system of claim 15 in which each said switching system connects said one terminal of its associated variable sensing capacitor to a different one of said nodes in the first phase and swaps them to the other nodes in the second phase.

18. A variable capacitance switched capacitor sigma delta modulator system comprising:

a differential integrator circuit having first and second input summing nodes;

first and second variable sensing capacitors;

first and second switching systems associated with said first and second variable sensing capacitors, respectively, each said switching system connecting one terminal of its associated variable sensing capacitor to one of said nodes in a first phase and to the other of said nodes in a second phase; and each of said variable sensing capacitors having a shared second terminal for receiving a first voltage level in said first phase and a second voltage level in said second phase for transferring the charge on the associated said variable sensing capacitor to said one summing node in said first phase and to the other summing node in said second phase and canceling in each phase in the differential circuit output caused by leakage current.

19. A switching method for a variable capacitance switched capacitor input system having a differential integrator circuit having first and second input summing nodes, a variable sensing capacitor and second terminal of said variable sensing capacitor comprising:

connecting one terminal of said variable sensing capacitor to one of said summing nodes in a first phase and to the other of said summing nodes in a second phase; and applying to said second terminal of said variable capacitor a first voltage level in said first phase and a second voltage level in said second phase for transferring the charge on said variable sensing capacitor to said first summing node in said first phase and to said second summing node in said second phase and canceling errors in the differential integrator circuit output caused by leakage current.

* * * * *